(12) United States Patent
Furuta et al.

(10) Patent No.: US 9,530,430 B2
(45) Date of Patent: Dec. 27, 2016

(54) VOICE EMPHASIS DEVICE

(71) Applicant: MITSUBISHI ELECTRIC CORPORATION, Chiyoda-ku (JP)

(72) Inventors: Satoru Furuta, Chiyoda-ku (JP); Kosuke Hosoya, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/769,639

(22) PCT Filed: Jan. 15, 2014

(86) PCT No.: PCT/JP2014/050573
§ 371 (c)(1),
(2) Date: Aug. 21, 2015

(87) PCT Pub. No.: WO2014/129233
PCT Pub. Date: Aug. 28, 2014

(65) Prior Publication Data
US 2016/0005420 A1   Jan. 7, 2016

(30) Foreign Application Priority Data
Feb. 22, 2013   (JP) ................ 2013-033347

(51) Int. Cl.
*G10L 21/013* (2013.01)
*G10L 21/02* (2013.01)
(Continued)

(52) U.S. Cl.
CPC ....... *G10L 21/0364* (2013.01); *G10L 21/0332* (2013.01); *G10L 25/18* (2013.01); *G10L 25/21* (2013.01); *H03G 9/025* (2013.01)

(58) Field of Classification Search
CPC ...... G10L 21/00; G10L 21/0208; G10L 21/10; G10L 21/12; G10L 21/14; G10L 21/0224; G10L 21/0232; G10L 21/0272; G10L 21/0324; G10L 21/0332; G10L 21/038; G10L 21/0388; G10L 21/057; G10L 2025/937
(Continued)

(56) References Cited

U.S. PATENT DOCUMENTS

| 5,463,716 A | 10/1995 | Taguchi |
| 2002/0111796 A1 | 8/2002 | Nemoto |

(Continued)

FOREIGN PATENT DOCUMENTS

| CN | 103632676 A | * 3/2014 |
| JP | 62-54300 A | 3/1987 |

(Continued)

OTHER PUBLICATIONS

Satoru Furuta, et al., "Speech enhancement by superposing outband high frequency component of input signal on low frequency signal," Institute of Electronics, Information and Communication Engineers Society Conference, A-4-19, Sep. 2013, p. 71 (with partial translation).

(Continued)

*Primary Examiner* — Marivelisse Santiago Cordero
*Assistant Examiner* — Stephen Brinich
(74) *Attorney, Agent, or Firm* — Oblon, McClelland, Maier & Neustadt, L.L.P.

(57) ABSTRACT

An input signal analyzer determines a boundary frequency within the limit of a range which does not exceed a first frequency from the mode of an input signal. A spectrum compressor compresses a power spectrum of frequencies in a band higher than the first frequency in a frequency direction. A gain corrector performs a gain correction on the compressed power spectrum. A spectrum synthesizer reflects the power spectrum outputted from the gain corrector in a (Continued)

band determined by both the first frequency and the boundary frequency. A frequency-to-time converter converts both a synthesized power spectrum provided by the spectrum synthesizer and a phase spectrum of the input signal into ones in the time domain, and outputs these spectra.

11 Claims, 6 Drawing Sheets

(51) Int. Cl.
*G10L 21/0364* (2013.01)
*H03G 9/02* (2006.01)
*G10L 21/0332* (2013.01)
*G10L 25/18* (2013.01)
*G10L 25/21* (2013.01)

(58) Field of Classification Search
USPC ............... 704/226–228, 203–205, 233–235, 209,704/275, 2, 246, 270; 381/94.1, 56
See application file for complete search history.

(56) References Cited

U.S. PATENT DOCUMENTS

| | | | |
|---|---|---|---|
| 2003/0221630 A1* | 12/2003 | Suzuki | A01K 15/021 119/174 |
| 2006/0241938 A1 | 10/2006 | Hetherington et al. | |
| 2006/0247922 A1 | 11/2006 | Hetherington et al. | |
| 2007/0127733 A1* | 6/2007 | Henn | G10L 19/008 381/80 |
| 2008/0129350 A1 | 6/2008 | Mitsufuji et al. | |
| 2008/0219344 A1* | 9/2008 | Suzuki | G10L 21/038 375/240.01 |
| 2012/0095755 A1* | 4/2012 | Otani | G10L 21/0208 704/205 |
| 2012/0095759 A1 | 4/2012 | Hetherington et al. | |
| 2013/0058500 A1 | 3/2013 | Mitsufuji et al. | |
| 2015/0086038 A1* | 3/2015 | Stein | G10L 21/0272 381/92 |
| 2015/0245137 A1* | 8/2015 | Sugano | G10L 21/0232 381/73.1 |

FOREIGN PATENT DOCUMENTS

| | | |
|---|---|---|
| JP | 8-321792 A | 12/1996 |
| JP | 2002-244686 A | 8/2002 |
| JP | 2008-537174 A | 9/2008 |
| JP | 2011-141551 A | 7/2011 |
| JP | 2012-83790 A | 4/2012 |
| JP | 2012-145659 A | 8/2012 |

OTHER PUBLICATIONS

Andrea Simpson, "Frequency-Lowering Device for Managing High-Frequency Hearing Loss: A Review," Trends in Amplification, vol. 13, No. 2, Jun. 2009, pp. 87-106.
International Search Report issued Apr. 22, 2014 in PCT/JP2014/050573 filed Jan. 15, 2014.

* cited by examiner

VOICE EMPHASIS DEVICE

FIELD OF THE INVENTION

The present invention relates to a voice emphasis device which is used for an improvement in the tone quality of a voice communication system, such as car navigation, mobile phones, interphones, and sound collecting devices, a hands-free call system, a TV conference system, a monitoring system, a broadcasting system, a voice synthesis system, etc. in which voice communications, a voice storage, a voice synthesis, and a voice recognition system are introduced, and for an improvement in the recognition rate of the voice recognition system, and which provides an improvement in the quality and intelligibility of a voice signal.

BACKGROUND OF THE INVENTION

In analog telephones, an upper limit frequency of the frequency band of a voice signal sent via a telephone line is band-limited narrowly to 3,400 Hz, for example. Therefore, it cannot be said that the sound quality of a conventional telephone line is good. Further, because the bandwidth is limited by a severe restriction on the bit rate in the case of digital speech communications, such as mobile phone communications and wireless communications for commercial use, like in the case of analog channels, also in this case, it cannot be said that the sound quality is good. Although a voice consonant component and a voice's own "individual nature (person likeness)" and "naturalness" often exist also in a band equal to or higher than 3,400 Hz, they are greatly lost due to the above-mentioned bandwidth limitation.

By the way, in recent years, it has become possible to carry out radio transmission of a voice signal in a wide band (e.g., an upper limit frequency is 7,000 Hz) at a low bit rate as audio compression technologies (voice coding techniques) move forward. However, because both a transmitting side terminal and a receiving side terminal need to support a corresponding wideband voice encoding method and a corresponding wideband voice decoding method, respectively, and both base stations need to be also equipped fully with a network for wide band encoding, such radio transmission is put to practical use only in some communication systems for commercial use, and, in the case of implementing such radio transmission in a public telephone communication network, not only a large economic burden is imposed, but also it takes much time before it is widely available.

To solve this problem, a trial of compressing the frequency of a voice signal to make an entire spectrum of the voice signal fall within a passband has been performed. A problem with this method is, however, that while the voice signal including signals in a lower frequency band including voice fundamental periods (pitches) is compressed to a lower frequency range, as compared with the original voice signal, when this compressed signal is reproduced without being expanded, the reproduced voice has a low pitch unnaturally, and lacks the individual nature and its quality degrades remarkably. In contrast with this, although this problem can be solved by expanding the compressed signal in the receiving side terminal, in order to implement this expansion, the receiving side terminal needs to support an operation of expanding a high band signal compressed by the transmitting side terminal. Like in the case of supporting band broadening, such a solution is not practical for a communication terminal which is not ready for transmission of compressed information together with a voice signal, and expansion of the compressed information.

For the above-mentioned problem, for example, there has been provided a technique described in patent reference 1. In this technique, by using a method of compressing only a predetermined high-frequency region without changing the voice pitch, a clear voice signal is acquired.

RELATED ART DOCUMENT

Patent Reference

Patent reference 1: Japanese Unexamined Patent Application Publication No. 2011-141551

SUMMARY OF THE INVENTION

Problems to be Solved by the Invention

However, while the conventional technology disclosed by above-mentioned patent reference 1 has an advantage of maintaining the individual nature of a voice, a problem with the conventional technology is that because a compressed high band signal component is simply mapped onto a fixed band which is predetermined within a low-frequency region, there is a case in which the above-mentioned bandwidth is not optimal depending on the mode of the voice which is the input signal, and, in this case, degradation in the sound quality is not avoided.

The present invention is made in order to solve the above-mentioned problems, and it is therefore an object of the present invention to provide a voice emphasis device that can generate a high-quality voice.

Means for Solving the Problem

In accordance with the present invention, there is provided a voice emphasis device including: a time-to-frequency converter that converts an input signal in the time domain into a power spectrum which is a signal in the frequency domain; an input signal analyzer that analyzes the mode of the input signal from the power spectrum; a band determinator that determines a boundary frequency within the limit of a range which does not exceed a predetermined first frequency from the mode of the input signal; a spectrum compressor that compresses a power spectrum of frequencies in a band higher than the first frequency in a frequency direction; a spectrum synthesizer that reflects the compressed power spectrum in a band determined by both the first frequency and the boundary frequency; and a frequency-to-time converter that converts both a synthesized power spectrum outputted from the spectrum synthesizer and a phase spectrum of the input signal into ones in the time domain, to acquire an emphasized signal.

Advantages of the Invention

Because the voice emphasis device in accordance with the present invention determines the boundary frequency which determines a band in which a high frequency component is reflected on the basis of the mode of the input signal, the voice emphasis device can prevent a strange sound from being caused by the spectrum synthesis, and perform an excellent and clear voice emphasis process.

EMBODIMENTS OF THE INVENTION

Hereafter, in order to explain this invention in greater detail, the preferred embodiments of the present invention will be described with reference to the accompanying drawings.

Embodiment 1

Figure 1:
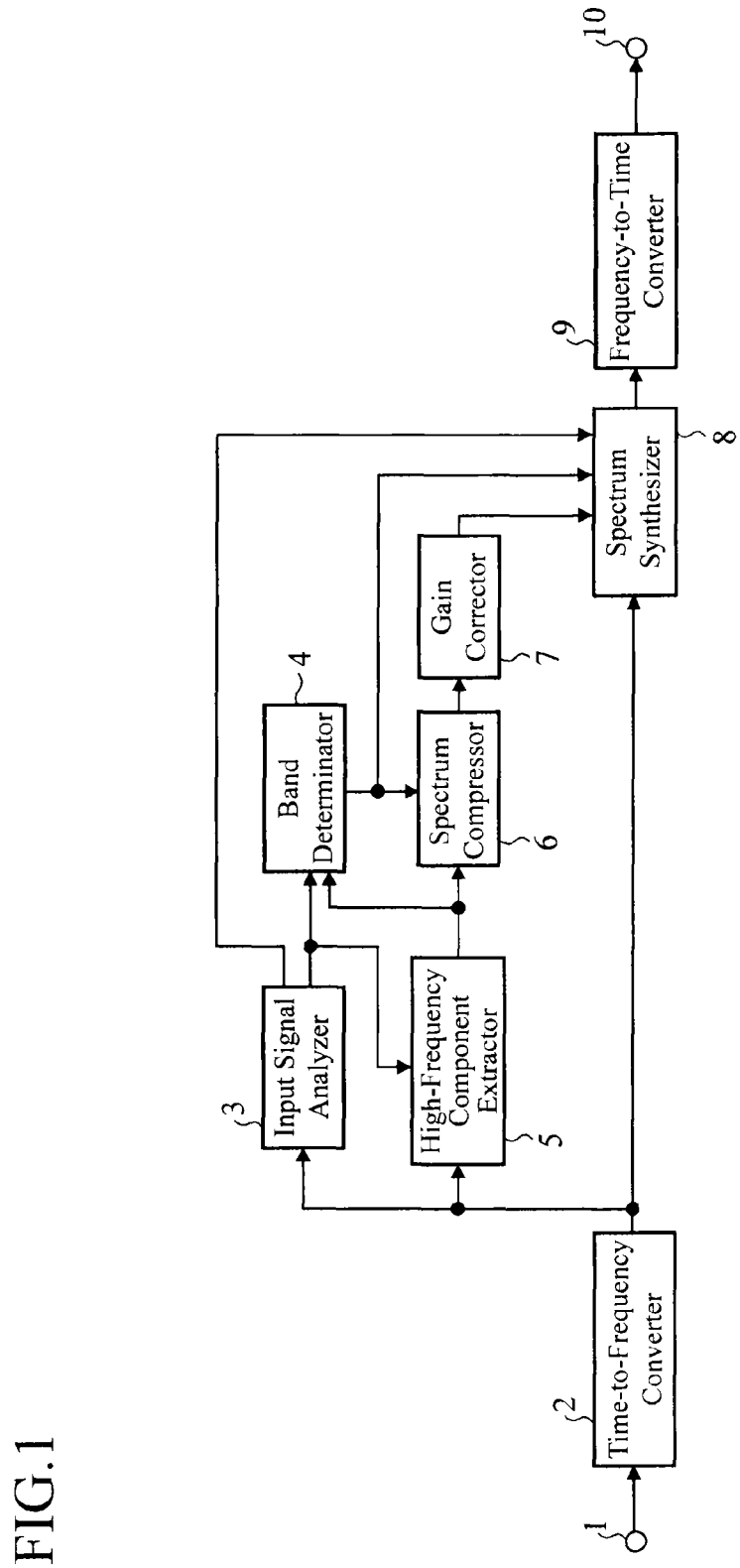
FIG. 1 is a structural diagram showing a voice emphasis device in accordance with Embodiment 1 of the present invention.
Figure 2:
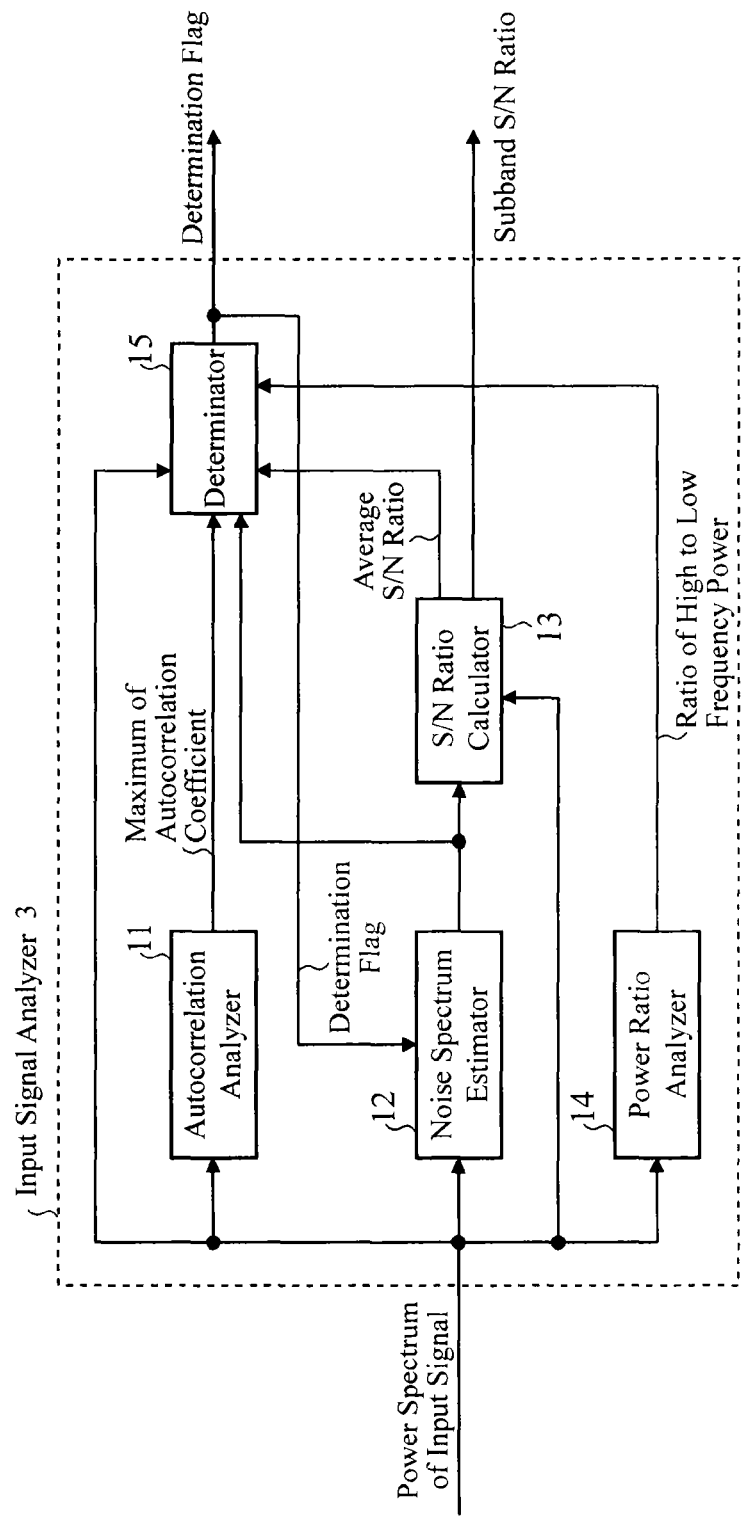
FIG. 2 is a structural diagram showing the details of an input signal analyzer of the voice emphasis device in accordance with Embodiment 1 of the present invention.

FIG. 1 is a structural diagram showing a voice emphasis device in accordance with Embodiment 1 of the present invention. The voice emphasis device in accordance with this Embodiment 1 is configured with an input terminal 1, a time-to-frequency converter 2, an input signal analyzer 3, a band determinator 4, a high frequency component extractor 5, a spectrum compressor 6, a gain corrector 7, a spectrum synthesizer 8, a frequency-to-time converter 9, and an output terminal 10. FIG. 2 shows the internal structure of the input signal analyzer 3, and the input signal analyzer 3 is configured with an autocorrelation analyzer 11, a noise spectrum estimator 12, an S/N ratio calculator 13, a power ratio analyzer 14, and a determinator 15.

The input terminal 1 is a terminal to which a signal, such as a voice signal, is inputted as an input signal. The time-to-frequency converter 2 is a processor that converts the input signal in the time domain into a power spectrum which is a signal in the frequency domain. The input signal analyzer 3 is a processor that analyzes the mode of the input signal indicating that the input signal is a voice or noise, and, when the input signal is a voice, this voice is a vowel or a consonant, from the power spectrum outputted from the time-to-frequency converter 2. The band determinator 4 is a processor that determines a boundary frequency within the limit of a range which does not exceed a predetermined first frequency from the mode of the input signal analyzed by the input signal analyzer 3. The high frequency component extractor 5 is a processor that extracts a power spectrum of frequencies in a band higher than the first frequency. The spectrum compressor 6 is a processor that compresses the power spectrum in the band, which is extracted by the high frequency component extractor 5, in a frequency direction. The gain corrector 7 is a processor that performs a gain correction on the power spectrum which is compressed by the spectrum compressor 6. The spectrum synthesizer 8 is a processor that reflects the compressed power spectrum on which the gain correction is performed by the gain corrector 7 in a band determined by both the first frequency and the boundary frequency. The frequency-to-time converter 9 is a processor that converts both a synthesized power spectrum outputted from the spectrum synthesizer 8, and a phase spectrum of the input signal into signals in the time domain, to acquire an emphasized voice (emphasized signal). The output terminal 10 is a terminal that outputs the emphasized voice outputted from the frequency-to-time converter 9 to outside the voice emphasis device.

Next, the details of the input signal analyzer 3 shown in FIG. 2 will be explained.

The autocorrelation analyzer 11 is a processor that determines a normalized autocorrelation function from the power spectrum of the input signal. The noise spectrum estimator 12 is a processor that determines an estimated noise spectrum from the power spectrum of the input signal. The S/N ratio calculator 13 is a processor that calculates an average S/N ratio of the current frame from both the power spectrum outputted by the time-to-frequency converter 2 and the estimated noise spectrum outputted by the noise spectrum estimator 12. The power ratio analyzer 14 is a processor that determines a ratio of high to low frequency power from the power spectrum of the input signal. The determinator 15 is a processor that receives the power spectrum outputted by the time-to-frequency converter 2, a maximum of the normalized autocorrelation function acquired by the autocorrelation analyzer 11, the ratio of high to low frequency power acquired by the power ratio analyzer 14, and the estimated noise spectrum outputted by the noise spectrum estimator 12, and determines whether the input signal of the current frame is a voice (vowel, consonant) or noise.

Hereafter, the principle of operation of the voice emphasis device in accordance with the present invention will be explained with reference to FIGS. 1 and 2.

First, after a voice, music, or the like which is captured via a microphone or the like is A/D (analog-to-digital) converted into a signal, and this signal is sampled at a predetermined sampling frequency (e.g., 16 kHz) and is also divided on a frame by frame basis (e.g., 10 ms), and is then inputted to the voice emphasis device via the input terminal 1. In this embodiment, an explanation will be made by assuming that a process signal which is finally acquired has a band of 0 Hz to 3,400 Hz (first frequency) while this band of 0 Hz to 3,400 Hz is referred to as a pass band and a band of 3,400 Hz to 8,000 Hz is referred to as a high frequency band. Further, it is assumed that, unless otherwise specified, the process is performed on a signal in a band of 0 to 8,000 Hz including the pass band and the high frequency band. Further, the explanation will be made while a signal in the high frequency band is also referred to as a high frequency component.

The time-to-frequency converter 2 applies, for example, a Hanning window to the input signal x(t) which is divided on a frame by frame basis, and, after that, performs a 512-point fast Fourier transform (FFT), as shown in, for example, the following equation (1), to convert the signal in the time domain into spectral components X(λ, k) which are a signal in the frequency domain.

$$X(\lambda,k)=FT[x(t)] \qquad (1)$$

In this equation, t denotes a sampling time, λ denotes a frame number at the time when the input signal is divided into frames, k denotes a number (referred to as a spectrum number from here on) for specifying a frequency component in the frequency band of the spectrum, and FT[·] denotes the fast Fourier transform process. Then, by using the following equation (2), while a power spectrum Y(λ, k) is acquired from the spectral component of the input signal, a phase spectrum θ(λ, k) is also acquired.

$$Y(\lambda,k)=\sqrt{Re\{X(\lambda,k)\}^2+Im\{X(\lambda,k)\}^2}; 0 \le k < 256 \qquad (2)$$

In this equation, $\text{Re}\{X(\lambda, k)\}$ and $\text{Im}\{X(\lambda, k)\}$ denote the real and imaginary parts of the input signal spectrum after the Fourier transform, respectively.

The input signal analyzer 3 determines whether the input signal of the current frame is a voice or noise. Further, when the input signal is a voice, the input signal analyzer also performs determination of whether the voice is a vowel or a consonant. First, the autocorrelation analyzer 11 determines a normalized autocorrelation function $\rho_N(\lambda, \tau)$ from the power spectrum $Y(\lambda, k)$ by using the following equations (3).

$$\rho(\lambda, \tau) = FT[Y(\lambda, k)], \quad (3)$$

$$\rho_N(\lambda, \tau) = \frac{\rho(\lambda, \tau)}{\rho(\lambda, 0)},$$

In these equations, $\tau$ denotes a delay time and $FT[\bullet]$ denotes the Fourier transform process. For example, the fast Fourier transform should just be performed at the same number of points=512 as that in equation (1). Because equation (3) is based on the Wiener-Khintchine theorem, the explanation of this equation will be omitted hereafter. Next, a maximum $\rho_{max}(\lambda)$ of the normalized autocorrelation function is calculated by using equation (4). Equation (4) means that the maximum of $\rho(\lambda, \tau)$ is searched for within a range of $32 \leq \tau \leq 192$.

$$\rho_{max}(\lambda) = \max[\rho(\lambda, \tau)], 32 \leq \tau \leq 192 \quad (4)$$

The S/N ratio calculator 13 then receives the power spectrum $Y(\lambda, k)$ outputted by the time-to-frequency converter 2, and the estimated noise spectrum $N(\lambda, k)$ outputted by the noise spectrum estimator 12 which will be mentioned below, and calculates an average S/N ratio $SNR_{AVE}(\lambda)$ of the current frame.

$$SNR_{AVE}(\lambda) = 10 \cdot \log_{10}(S_{pow}(\lambda) / N_{pow}(\lambda)) \quad (3)$$

$$S_{pow}(\lambda) = \sum_{k=0}^{255} Y(\lambda, k),$$

$$N_{pow}(\lambda) = \sum_{k=0}^{255} N(\lambda, k)$$

In equation (5), $N(\lambda, k)$ denotes the estimated noise spectrum, and $S_{pow}$ and $N_{pow}$ denote the sum total of the power spectra of the input signal and the sum total of the estimated noise spectra, respectively.

Further, the S/N ratio calculator calculates, as an S/N ratio of each spectral component, a subband S/N ratio $SNR(\lambda, k)$ by using equation (6), and outputs the subband S/N ratio to the spectrum synthesizer 8 which will be mentioned below.

$$SNR(\lambda) = 10 \cdot \log_{10}(Y(\lambda)/N(\lambda)) \quad (6)$$

The power ratio analyzer 14 calculates the ratio of the high frequency power of the input signal of the current frame to the low frequency power of the input signal (ratio of high to low frequency power). This ratio approximates the gradient of the spectrum which goes from a low frequency to a high frequency, and there is a high possibility that the voice is a consonant when the high frequency power is larger than the low frequency power, and it can be therefore determined whether the mode of the input signal is a vowel or a consonant by using this value. Concretely, as shown in, for example, equation (7), the ratio of the power in a band of 125 Hz to 3,000 Hz to that in a band of 3,000 Hz to 6,000 Hz is determined.

$$P_{Ratio}(\lambda) = \frac{P_{S\_High}(\lambda)}{P_{S\_Low}(\lambda)} \quad (7)$$

In this equation, $P_{S\_Low}(\lambda)$ denotes the power in the band of 125 Hz to 3,000 Hz of the input signal and $P_{S\_High}(\lambda)$ denotes the power in the band of 3,000 Hz to 6,000 Hz of the input signal, and these powers are calculated as follows.

$$P_{S\_Low}(\lambda) = \frac{1}{(96-4+1)} \sum_{k=4}^{96} Y(\lambda, k) \quad (8)$$

$$P_{S\_High}(\lambda) = \frac{1}{(192-97+1)} \sum_{k=97}^{192} Y(\lambda, k)$$

The ratio of high to low frequency power $P_{Ratio}(\lambda)$ of the current frame, which is acquired as above, is outputted to the determinator 15.

The determinator 15 receives the power spectrum $Y(\lambda, k)$ outputted by the time-to-frequency converter 2, the maximum $\rho_{max}(\lambda)$ of the normalized autocorrelation function acquired by the autocorrelation analyzer 11, the ratio of high to low frequency power $P_{Ratio}(\lambda)$ acquired by the power ratio analyzer 14, and the estimated noise spectrum $N(\lambda, k)$ outputted by the noise spectrum estimator 12 which will be mentioned below, and determines whether the input signal of the current frame is a voice (vowel, consonant) or noise, and outputs the result of the determination as a determination flag. As a method of determining a voice/noise section, for example, when a condition given by the following equation (9) is satisfied, it is determined that the input signal is a voice, and the determination flag Vflag is set to "1 (voice)"; otherwise, the determination flag Vflag is set to "0 (noise)", and the determination flag is outputted.

$$Vflag = \begin{cases} 1, & \text{if } SNR_{AVE}(\lambda) > TH_{FR\_SN} \text{ or } \rho_{max}(\lambda) > TH_{ACF} \\ 0, & \text{Otherwise} \end{cases} \quad (9)$$

Further, when it is determined using equation (9) that the input signal is a voice, if the ratio of high to low frequency power $P_{Ratio}(\lambda)$ outputted by the power ratio analyzer 14 exceeds a predetermined threshold, it is determined that the input signal is a consonant, and the determination flag Vflag is set to "2 (consonant)" by using the following equation (10), and the determination flag is outputted.

$$Vflag = \begin{cases} 2, & \text{if } P_{Ratio}(\lambda) > TH_{POW\_Ratio} \text{ and } Vflag = 1 \\ 1, & \text{Otherwise} \end{cases} \quad (10)$$

In this equation, $TH_{FR\_SN}$, $TH_{ACF}$, and $TH_{POW\_Ratio}$ are predetermined constant thresholds for determination, and $TH_{PR\_SN}=3.0$, $TH_{ACF}=0.3$, and $TH_{POW\_Ratio}=1.25$ are provided as their preferable examples, but they can be varied properly according to the state and noise level of the input signal.

Although in this embodiment, as an input voice analyzing method, the autocorrelation function method, and the average S/N ratio and the ratio of high to low frequency power of the input signal are used, the input voice analyzing method is not limited to this method, and another method can be provided by, for example, using a known method, such as a cepstrum analysis. It is also possible to improve the accuracy of the determination by making a combination with one of various known methods, e.g., the number of zero crossings, at the discretion of a person skilled in the art.

The noise spectrum estimator 12 receives the power spectrum $Y(\lambda, k)$ outputted by the time-to-frequency converter 2 and the determination flag Vflag outputted by the determinator 15, estimates and updates a noise spectrum according to both the following equation (11) and the determination flag Vflag, and outputs an estimated noise spectrum $N(\lambda, k)$.

$$N(\lambda, k) = \begin{cases} (1-\alpha)\cdot N(\lambda-1, k) + \alpha \cdot |Y(\lambda, k)|^2 & \text{if } Vflag = 0 \\ N(\lambda-1, k) & \text{if } Vflag = 1 \text{ or } Vflag = 2 \end{cases} ; \quad (11)$$

$$0 \le k < 256$$

In this equation, $N(\lambda-1, k)$ denotes the estimated noise spectrum of the preceding frame, and is held in a storage, such as a RAM (Random Access Memory), in the noise spectrum estimator 12. When the determination flag Vflag=0 in equation (11), because the input signal of the current frame is determined to be noise, the estimated noise spectrum $N(\lambda-1, k)$ of the preceding frame is updated by using both the power spectrum $Y(\lambda, k)$ of the input signal, and an update coefficient $\alpha$. The update coefficient $\alpha$ is a predetermined constant having a range of $0<\alpha<1$ and $\alpha=0.95$ is provided as a preferable example. As an alternative, the update coefficient can be varied properly according to the state and noise level of the input signal.

In contrast, when the determination flag Vflag=1 or Vflag=2, the input signal of the current frame is a voice and the estimated noise spectrum $N(\lambda-1, k)$ of the preceding frame is outputted as the estimated noise spectrum $N(\lambda, k)$ of the current frame, just as it is.

The band determinator 4 receives the determination flag Vflag outputted by the input signal analyzer 3, and determines, for the pass band, a boundary frequency $B(\lambda)$ showing the width of a band with (or into) which a high frequency component, which will be mentioned below, is to be synthesized (or convolved). The boundary frequency $B(\lambda)$ can be determined by using, for example, equations (12) and (13). When the current frame is determined to be a noise section, in equation (12), the bandwidth is minimized, more specifically, the boundary frequency is determined to be a value (3,300 Hz) close to 3,400 Hz which is an upper limit frequency of the pass band. Further, when the current frame is a voice section and is a vowel, because the formant of the voice concentrates at frequencies equal to or lower than 3,000 Hz in many cases, in order to reflect the high frequency component while maintaining the formant equal to or lower than 3,000 Hz, the boundary frequency to be set is determined to be 3,000 Hz and the high frequency component is convolved into a bandwidth of 3,000 Hz to 3,400 Hz. Because a large amount of consonant component exists also in a high frequency range equal to or higher than 3,400 Hz when the input signal is a consonant, the band is widened in order to reflect this component in the pass band, more specifically, the boundary frequency is set to a value (2,500 Hz) lower than that for vowel, and the high frequency component is convolved into a band of 2,500 Hz to 3,400 Hz.

$$B_F = \begin{cases} 3300(\text{Hz}), & Vflag = 0 \\ 2500(\text{Hz}), & Vflag = 2 \\ 3000(\text{Hz}), & Vflag = 1 \end{cases} \quad (12)$$

After determining the basic boundary frequency by using above-mentioned equation (12), the band determinator refers to the power of the spectral component at the lowest one (3,400 Hz) of the high frequencies to be extracted, and moves the boundary frequency up or down and adjusts the boundary frequency to an optimal frequency in order to reduce a strange sound caused by a difference in the power (a level difference of the power spectrum) at the time of a frequency synthesis which will be mentioned below. More specifically, when $B_F=3,000$ Hz is selected in equation (12), for example, the power spectrum at a temporary boundary frequency and the power spectrum at 3,400 Hz are compared in a range (2,900 Hz to 3,100 Hz) of ±100 Hz with respect to $B_F$, and, when the temporary boundary frequency which provides the smallest difference in the power is 2,980 Hz, the boundary frequency is corrected to $B_F=2,980$ Hz.

Next, the corrected boundary frequency $B_F$ is subjected to smoothing in a temporal direction of the boundary frequency by using the boundary frequency $B(\lambda-1)$ of the preceding frame, as shown in equation (13), in order to prevent the occurrence of a strange sound which is caused by a sudden change in the bandwidths of frames.

$$\begin{cases} B(\lambda) = (1-W_B)\cdot B(\lambda-1) + W_B \cdot B_F, & \lambda > 0 \\ B(\lambda) = 3300, & \lambda = 0 \end{cases} \quad (13)$$

In this equation, $W_B$ denotes a predetermined constant for the smoothing in the temporal direction and $W_B=0.8$ is provided as a preferable example. As an alternative, $W_B$ can be varied properly in such a way that the band determinator operates excellently according to the type of the input signal, etc.

The high frequency component extractor 5 extracts a high frequency component on the basis of the determination flag outputted by the input signal analyzer 3. In this embodiment, because the frequency range of the high frequency component is the one from 3,400 Hz to 8,000 Hz, the power spectrum $Y(\lambda, k)$ in this range is extracted, and is outputted as the power spectrum $Y_h(\lambda, k)$ of the high frequency component.

The high frequency component extractor can be configured to perform the extraction when the determination flag shows a voice section, whereas not perform the extraction when the determination flag shows a noise section (or silent section). In this case, because the below-mentioned spectrum compressing process and the below-mentioned spectrum synthesizing process are not performed, the throughput can be reduced. The extracted high frequency component is sent to the spectrum compressor 6 in the next stage.

The spectrum compressor 6 performs band compression in the frequency direction of the spectrum on the power spectrum $Y_h(\lambda, k)$ of the high frequency component extracted according to the high frequency component extractor 5 in such a way that the spectrum can be synthesized with that on the pass band, so that the bandwidth of the high frequency component is made to match that of the pass band.

When the bandwidth indicated by the boundary frequency B(λ) and the upper limit frequency $B_{NL}$=3, 400 Hz of the pass band, i.e., the bandwidth with which the high frequency component is reflected in the pass band is expressed by $B_{W\_C}(\lambda)$, and the bandwidth of the band between the upper limit frequency $B_{NH}$=8,000 Hz of the high frequency band and the upper limit frequency $B_{NL}$=3,400 Hz of the pass band, i.e., the bandwidth of the high frequency component is expressed by $B_{W\_H}$, linear compression on the spectrum band can be expressed by the following equation (14), for example.

$$Y_m(\lambda, k+B(\lambda))=Y(\lambda, B_{NL}+\lfloor k \cdot B_{W\_H}/B_{W\_C}\rfloor), k=0, \ldots, B_{W\_C}(\lambda) \quad (14)$$

In this equation, $Y_m(\lambda, k)$ denotes the power spectrum of the high frequency component on which the frequency compression is performed. Further, $\lfloor x \rfloor$ is a floor function which provides the largest integer that does not exceed x. As a concrete example, when, for example, B(λ)=3,050 Hz, the compression in the frequency direction is performed on the spectrum from 3,400 Hz to 8,000 Hz which is the high frequency component in such a way that the spectrum can be reflected in a narrower range of 3,050 Hz to 3,400 Hz on the pass band.

The gain corrector 7 performs a power correction on the power spectrum $Y_m(\lambda, k)$ of the high frequency component on which the frequency compression is performed. Basically, the gain corrector performs the correction in such a way that the power of the band before the compression, i.e., the power of the band of 3,400 Hz to 8,000 Hz before the compression is equal to that of the spectral component after the compression. As an alternative, the power spectrum can be multiplied by a correction coefficient in such a way that the power spectrum is preferable in terms of audibility. The gain corrector outputs the power spectrum $\hat{Y}_m(\lambda, k)$ of the high frequency component on which the frequency compression and the gain correction are performed to the spectrum synthesizer 8.

By using both the high frequency component spectrum $\hat{Y}_m(\lambda, k)$ on which the frequency compression and the gain correction are performed, and the power spectrum Y(λ, k) of the pass band, the spectrum synthesizer 8 synthesizes the spectra according to the following equation, to acquire a power spectrum $Y_{EMP}(\lambda, k)$ of an emphasized voice.

In the spectrum synthesis, the spectrum synthesizer makes a comparison between the subband S/N ratio SNR(λ, k) of the spectral component of the pass band, and the subband S/N ratio $SNR_m(\lambda, k)$ of the spectral component in the high-frequency region on which the frequency compression is performed, by using the subband S/N ratios outputted by the input signal analyzer 3, and selects a power spectrum having a larger one of the subband S/N ratios, to acquire the power spectrum of the emphasized voice, as shown in equation (15).

$$Y_{EMP}(\lambda, k) = \begin{cases} \hat{Y}_m(\lambda, k), & \text{if } SNR_m(\lambda, k) > SNR(\lambda, k) \\ Y(\lambda, k), & \text{if } SNR_m(\lambda, k) \le SNR(\lambda, k) \end{cases} \quad (15)$$

$$k = B(\lambda), \ldots, B_{W\_C}(\lambda) + B(\lambda)$$

In this equation, $B_{W\_C}(\lambda)$ denotes the bandwidth indicated by the boundary frequency B(X) and the upper limit frequency $B_{NL}$=3,400 Hz of the pass band, like that described for the spectrum compressor 6. Next, after the spectrum synthesis, the spectrum synthesizer performs smoothing between frequencies in a band close to the boundary frequency. The spectrum synthesizer performs the smoothing by using, for example, a known method, such as a moving average filter, in such a way that the power spectrum is smoothed within a range of ±100 Hz (a width of 200 Hz) with respect to the boundary frequency. The smoothing provides an advantage of being able to ease the difference (level difference) in the power of the power spectrum at the time of the spectrum synthesis, and prevent the occurrence of a strange sound.

After that, the spectrum synthesizer outputs the smoothed power spectrum $\hat{Y}_{EMP}(\lambda, k)$ of the emphasized voice to the frequency-to-time converter 9.

The frequency-to-time converter 9 receives both the smoothed power spectrum $\hat{Y}_{EMP}(\lambda, k)$ of the emphasized voice, and the phase spectrum θ(λ, k) of the input voice, and, after performing an inverse FTT, performs a downsampling process of converting the 16 kHz-sampled signal into a 8 kHz-sampled signal and making this signal pass through a low pass filter, to generate a time signal in the band of 0 Hz to 3, 400 Hz, and outputs this time signal from the output terminal 10.

Figure 3:
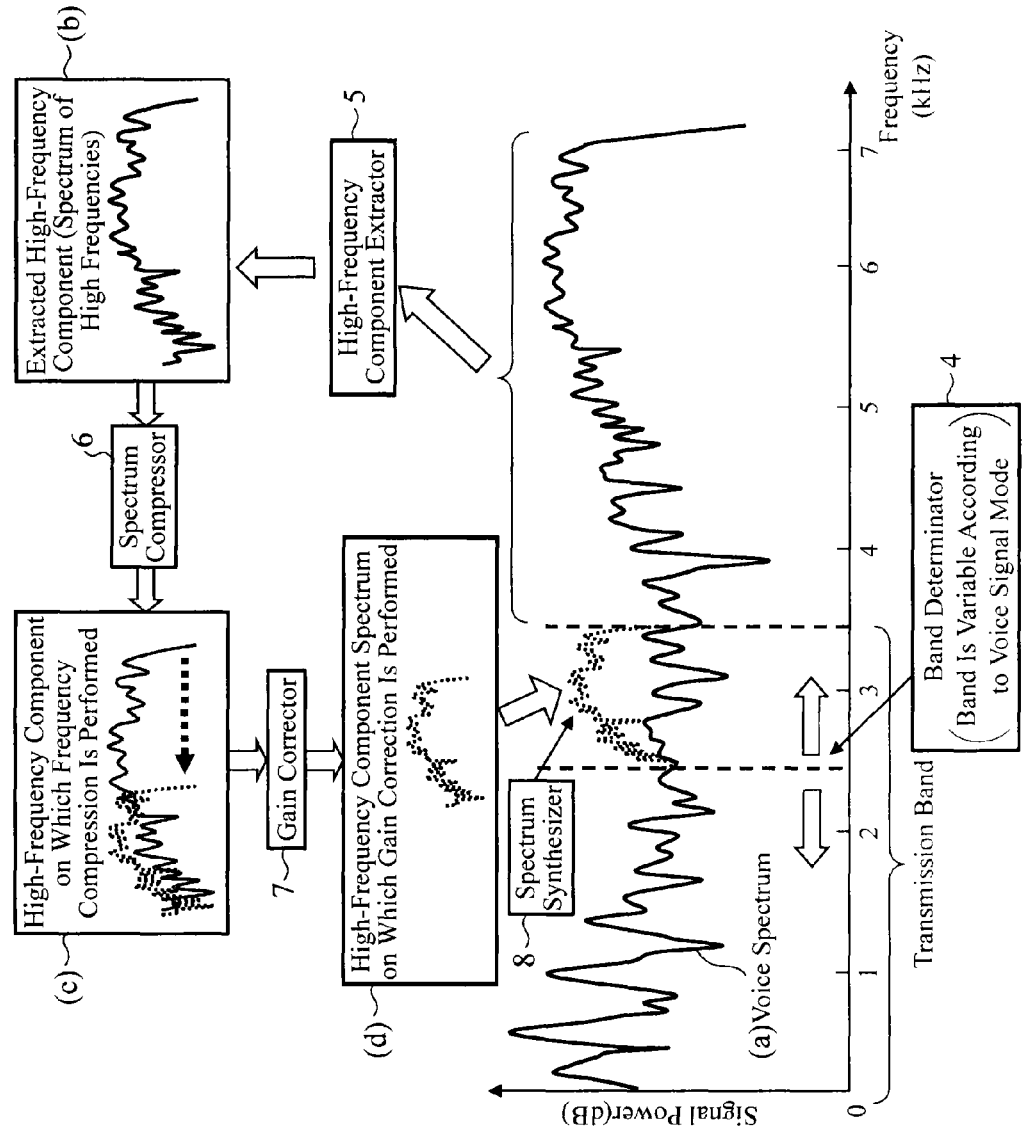
FIG. 3 is an explanatory drawing schematically showing a flow of a process performed by the voice emphasis device in accordance with Embodiment 1 of the present invention.

FIG. 3 schematically illustrates the series of principles of operation of this Embodiment 1 in order to explain them more intelligibly. (a) denotes the power spectrum of the inputted voice signal, (b) denotes the power spectrum of the high frequency component which is the output of the high frequency component extractor 5, (c) denotes the power spectrum of the high frequency component on which the frequency compression is performed, which is the output of the spectrum compressor 6, and (d) denotes the power spectrum of the high frequency component on which the frequency compression and the gain correction are performed, which is the outputs of the gain corrector 7. Arrows show the order of the processes.

Figure 4:
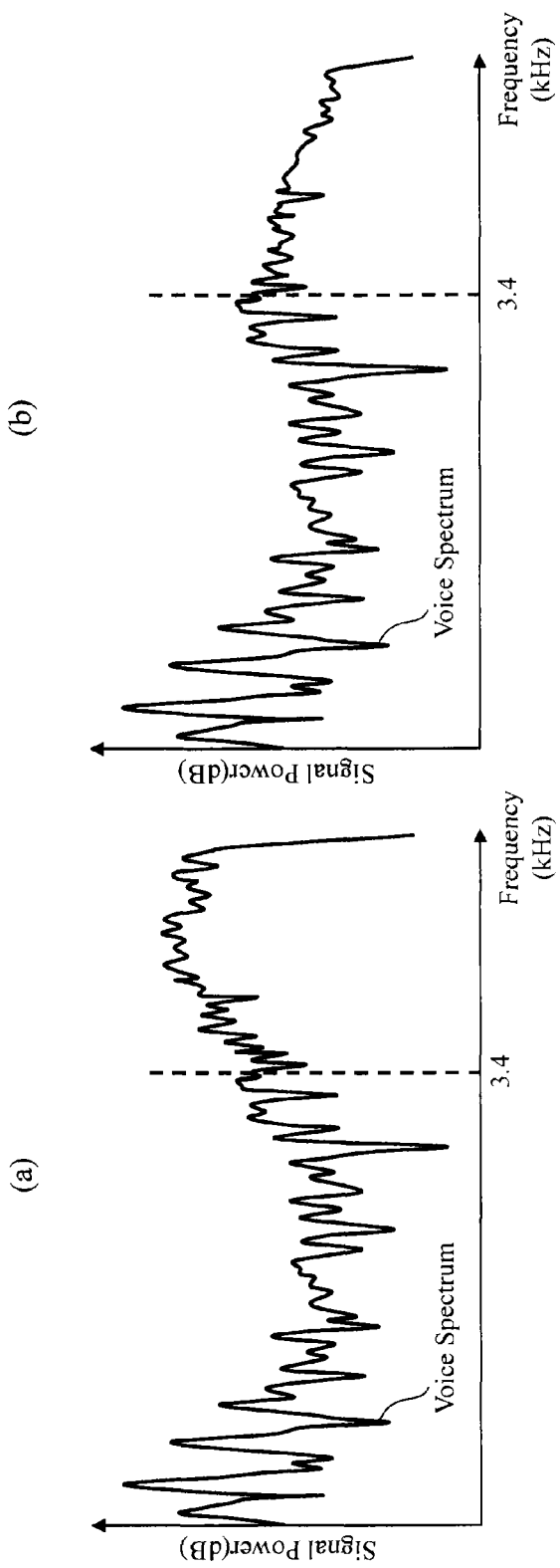
FIG. 4 is an explanatory drawing showing an example of an input signal spectrum provided by the voice emphasis device in accordance with Embodiment 1 of the present invention.
Figure 5:
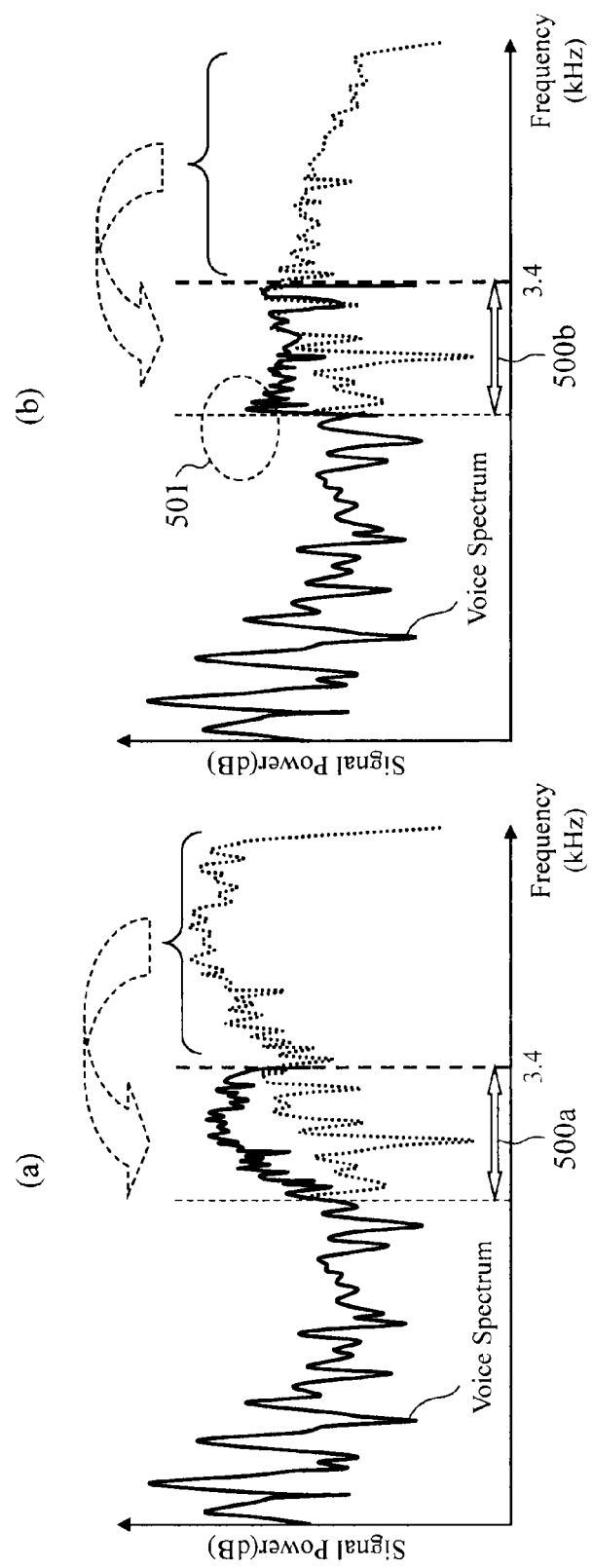
FIG. 5 is an explanatory drawing showing a voice emphasis process according to a conventional method.
Figure 6:
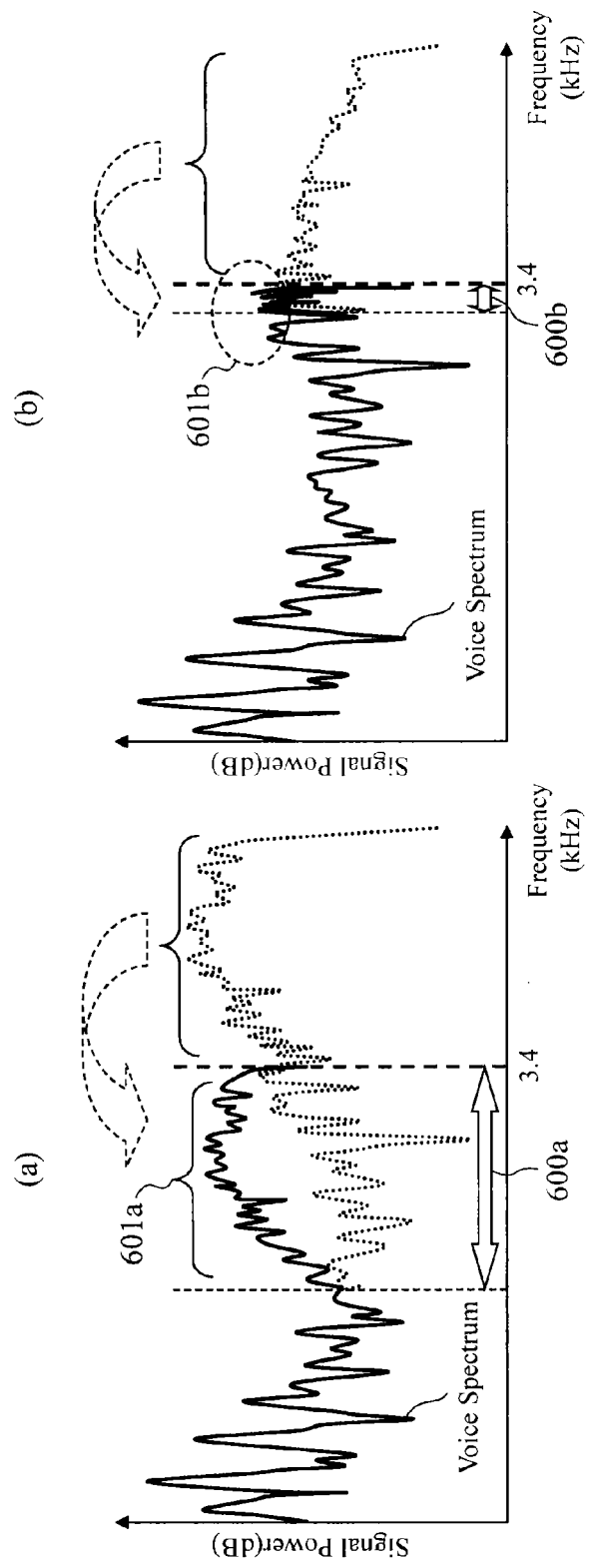
FIG. 6 is an explanatory drawing showing a voice emphasis process performed by the voice emphasis device in accordance with Embodiment 1 of the present invention.

FIG. 4 is examples of the input signal spectrum of a voice section. (a) is an example of a voice signal of a consonant section, and (b) is an example of a signal at a time when this signal is a consonant section, but the power of a high frequency component whose frequencies are equal to or higher than 3,400 Hz is small and the signal is deficient in consonant characteristics. FIG. 5 is an example of a case of performing a process according to a conventional method on the input signal shown in FIG. 4, and FIG. 6 is an example of a case of similarly performing the process in accordance with this Embodiment 1 on the input signal shown in FIG. 4. Because the bandwidth is fixed, as shown by an arrow 500a of (a) and an arrow 500b of (b), according to the conventional method of FIG. 5, a strange sound occurs in the processed voice in the case in which the voice signal is (b) without consonant characteristics (a peak component occurs in the spectrum and a strange sound occurs, as shown by a broken line 501). In contrast, according to the method in accordance with the present invention of FIG. 6, as shown by an arrow 600a of (a) and an arrow 600b of (b), because the bandwidth is made to be variable according to the mode of the input signal, not only consonant characteristics can be reflected surely in the pass band (the high frequency component is reflected in a wide low-frequency range, as shown by a range 601a) in the case in which the voice signal is (a), but also an excellent sound emphasis process which prevents a strange sound from occurring can be performed (the occurrence of a peak component is prevented and no strange sound occurs, as shown by a range 601b) even in the case of (b) in which the voice signal does not have consonant characteristics.

As mentioned above, because the voice emphasis device in accordance with this Embodiment 1 includes: the time-to-frequency converter that converts an input signal in the time domain into a power spectrum which is a signal in the frequency domain; the input signal analyzer that analyzes the mode of the input signal from the power spectrum; the band determinator that determines the boundary frequency within the limit of a range which does not exceed the predetermined first frequency from the mode of the input signal; the spectrum compressor that compresses a power spectrum of frequencies in a band higher than the first frequency in a frequency direction; the spectrum synthesizer that reflects the compressed power spectrum in a band determined by both the first frequency and the boundary frequency; and the frequency-to-time converter that converts both a synthesized power spectrum outputted from the spectrum synthesizer and a phase spectrum of the input signal into signals in the time domain, to acquire an emphasized signal, the voice emphasis device can emphasize the input signal by reflecting a high band signal having frequencies equal to or higher than the pass band according to the mode of the input signal. Therefore, the voice emphasis device can reflect the characteristics of the high frequency band in the pass band appropriately, and implement an excellent and clear sound emphasis process without a strange sound caused by the spectrum synthesis.

Further, because the voice emphasis device in accordance with this Embodiment 1 includes the gain corrector that, by correcting the power spectrum compressed by the spectrum compressor in such a way that the power of the power spectrum before the compression in the band on which the spectrum compressor performs the compression is equal to that of the power spectrum after the compression, or by multiplying the power spectrum by a predetermined correction coefficient which is determined on the basis of a cause of auditory, performs power correction on the compressed power spectrum, and the spectrum synthesizer reflects the power spectrum corrected by the gain corrector, the occurrence of a strange sound at the time of the spectrum synthesis can be prevented, and an excellent sound emphasis process can be implemented.

Further, because in the voice emphasis device in accordance with this Embodiment 1, when the compressed power spectrum is reflected, the band determinator determines, as the boundary frequency, a frequency which provides the smallest difference in power with the power spectrum belonging to the first frequency, the occurrence of a strange sound at the time of the spectrum synthesis can be prevented, and an excellent sound emphasis process can be implemented.

Further, because in the voice emphasis device in accordance with this Embodiment 1, the band determinator smooths the boundary frequency of the current frame in a temporal direction by using the boundary frequency of the preceding frame, the occurrence of a strange sound at the time of the spectrum synthesis can be prevented, and an excellent sound emphasis process can be implemented.

Further, because in the voice emphasis device in accordance with this Embodiment 1, the spectrum synthesizer compares the S/N ratio of the power spectrum of the input signal and the S/N ratio of the compressed power spectrum, to select a power spectrum having a higher S/N ratio, and generates the synthesized power spectrum, if the subband S/N ratio of the high frequency band signal is low at the time of the spectrum synthesis with the high frequency component, the voice emphasis device does not reflect the spectral component in the pass band. More specifically, because the voice emphasis device can prevent the high frequency component which has degraded from being reflected in the pass band, the voice emphasis device can implement an excellent sound emphasis process while preventing increase in the degradation of the sound quality.

Embodiment 2

Although in Embodiment 1, the control according to the mode of the input signal is performed by using the determination flag, which is the input signal analysis result, in the determination of the boundary frequency by the band determinator 4, the present invention is not limited to this embodiment, and the control can be performed by using, for example, both the average S/N ratio outputted by the S/N ratio calculator 13, and the ratio of high to low frequency power outputted by the power ratio calculator 14. At that time, instead of expressing the boundary frequency with three discrete values, as shown in equation (11), for example, the boundary frequency can be set to be a continuous value between 2,500 Hz to 3,400 Hz according to the values of both of the S/N ratios.

Concretely, because as the average S/N ratio $SNR_{AVE}(\lambda)$ becomes large, there is a higher possibility that the input signal is a voice, the boundary frequency $B(\lambda)$ is lowered so as to widen the bandwidth in which the high frequency component is reflected. Further, because as the ratio of high to low frequency power $P_{Ratio}(\lambda)$ becomes large, there is a higher possibility that the input signal is a consonant, the boundary frequency $B(\lambda)$ is lowered. In contrast, as the average S/N ratio $SNR_{AVE}(\lambda)$ becomes low, the boundary frequency $B(\lambda)$ is raised and the bandwidth in which the high frequency component is reflected is narrowed.

In accordance with this Embodiment 2, because the boundary frequency is continuously controllable according to the S/N ratio of the input signal, the bandwidth can be set to an optimal one according to the S/N ratio of the input signal. Further, because the reflection of an excessive high frequency component in the pass band is prevented by narrowing the band when the average S/N ratio of the input signal is low, increase of the degradation of the sound quality can be prevented and a further excellent sound emphasis process can be performed.

As previously explained, because in the voice emphasis device in accordance with Embodiment 2, the band determinator sets the boundary frequency to a low one when the S/N ratio of the input signal is high, and sets the boundary frequency to a higher one as the S/N ratio becomes low, increase of the degradation of the sound quality can be prevented and a further excellent sound emphasis process can be performed.

Embodiment 3

Although in Embodiment 1, the spectrum synthesizer 8 compares the subband S/N ratio of the high frequency component and the subband S/N ratio of the pass band and then performs the spectrum synthesis according to the subband S/N ratio, the spectrum synthesizer can alternatively take a weighted average of the power spectrum. $Y(\lambda, k)$ of the input signal and the power spectrum $Y_m(\lambda, k)$ of the high frequency component on which the frequency compression and the gain correction are performed, for each spectral component, as shown in equation (16), and perform the synthesis, instead of selecting spectral components by using the subband S/N ratio, to determine a power spectrum of an emphasized signal.

$$Y_{EMP}(\lambda,k)=(1-W_s(k))\cdot Y(\lambda,k)+W_s(k)\cdot \hat{Y}_m(\lambda,k) \quad (16)$$

In this equation, $W_s(k)$ denotes a predetermined constant for weighting, and can be set as a preferable example, as shown in equation (17), in such a way that the weight of the power spectrum of the high frequency component becomes large as frequency becomes high. As an alternative, $W_s(k)$ can be varied properly in such a way that the band determinator operates excellently according to the type of the input signal, etc.

$$W_s(k)=0.5+0.3\cdot(k/B_{W\_C}), k=0,\ldots,B_{W\_C} \quad (17)$$

In this equation, $B_{W\_C}(\lambda)$ denotes the bandwidth indicated by the boundary frequency $B(\lambda)$ and the upper limit frequency $B_{NL}=3{,}400$ Hz of the pass band, like that described for the spectrum compressor 6. Further, the constant value determining $W_s(k)$ can be adjusted to a preferable value in advance according to the mode of the input signal.

As mentioned above, because in the voice emphasis device in accordance with Embodiment 3, the spectrum synthesizer takes a weighted average of the power spectrum of the input signal and the compressed power spectrum to generate a synthesized power spectrum, there is provided an advantage of being able to ease power discontinuity of the spectrum in the frequency direction. Further, by, for example, enlarging the weight of the power spectrum of the high frequency component as the frequency becomes high, it becomes possible to reflect a larger amount of high frequency component in the high frequency band, and a more natural and clear sound emphasis process can be performed.

Embodiment 4

In above-mentioned Embodiment 1, when the spectrum is compressed in the frequency direction by the spectrum compressor 6, if peaks of the spectrum which are represented by formant frequencies (portions corresponding to "mountains" of the mountain valley structure of the spectrum) get close to each other, an echo may occur in the emphasized voice. In order to prevent this echo, for example, the power spectra corresponding to peaks are compared and a larger one of the components is selected, or the spectrum compression is not performed at frequencies close to the power spectrum corresponding to the peak so as to place the peaks apart from each other.

As previously explained, because in the voice emphasis device in accordance with Embodiment 4, when a plurality of power spectrum peaks are generated within a predetermined frequency at the time of the compression, the spectrum compressor selects a larger component from among the power spectra corresponding to the plurality of peaks, or does not perform the spectrum compression at frequencies close to the power spectra corresponding to the plurality of peaks, a feeling having a strange sound of the emphasized voice can be prevented and an excellent sound emphasis process can be performed because spectrum peaks which may cause an echo at the time of the spectrum compression can be placed apart from each other.

Embodiment 5

In a variant of Embodiment 4, a process on peaks of the power spectrum generated at the time of the spectrum synthesis in the spectrum synthesizer 8 will be explained hereafter as Embodiment 5.

When peaks of the spectrum which are represented by formant frequencies get close to each other, as a result of the spectrum synthesizer 8 synthesizing the power spectrum of the input signal and the power spectrum of the high frequency component on which the spectrum compression is performed, an echo may occur in the emphasized voice. In order to prevent this echo, the spectrum synthesizer performs, for example, a process of comparing a component corresponding to each peak of the power spectrum of the input signal and that of the power spectrum of the high frequency component, and selecting a large one of the components, or not performing the spectrum compression at frequencies close to the power spectrum corresponding to the peak, and performing the synthesis while making the peaks be apart from each other. As a result, the spectrum synthesizer can place spectrum peaks which may cause an echo at the time of the spectrum compression apart from each other.

As previously explained, because in the voice emphasis device in accordance with Embodiment 5, when a plurality of power spectrum peaks are generated within a predetermined frequency at the time of performing the synthesis, the spectrum compressor compares a component corresponding to each peak of the power spectrum of the input signal and that of the power spectrum of the high frequency component, and selects a larger one of the components, or does not perform the spectrum compression at frequencies close to the power spectra corresponding to the plurality of peaks, a feeling having a strange sound of the emphasized voice can be prevented and an excellent sound emphasis process can be performed because spectrum peaks which may cause an echo at the time of the spectrum compression can be placed apart from each other.

Although the pass band is explained with 3,400 Hz in each of the above-mentioned embodiments, the present invention is not limited to this example. For example, the present invention can be applied even to 7,000 Hz broad band transmission. In this case, for example, an input signal in an 11 kHz band can be inputted and analyzed.

In accordance with the present invention, because while a feeling of a wide band exceeding the pass band is provided and legibility is implemented, a process of expanding a high frequency component on a receive side, i.e., an additional process on a side of a receiving terminal becomes unnecessary, there is provided an advantage of providing an improvement in the quality without increase in the memory amount and increase in the throughput and regardless of the type of the receiving terminal.

Further, the present invention is not targeted for only a voice, and can also be applied to a non-voice signal, such as music. At that time, the input signal analyzer 3 is replaced by what is adapted for a musical sound, and what is necessary is just to perform the determination by using a known analysis means ready for musical sounds corresponding to consonants and vowels of voices.

In addition, because the present invention is not only effective as a measure of providing an improvement in the sound quality for bandwidth limitations at the time of wireless communication transmission, but also effective when a speaker is deficient in its high frequency reproduction ability and when the high frequency component declines in a loudspeaking broadcast or the like, and can reflect the characteristics of the high frequency component in a band which can be reproduced via a speaker and a low frequency band which hardly declines, there is provided an advantage of being able to reproduce a clear voice. Further, also when the sampling frequency is limited due to a limitation on the memory capacity of the storage device, and a limitation on the D/A (digital to analog) conversion in household electric appliances, toys, etc. on which a severe cost reduction requirement is imposed, which are represented by the oral reading of a TV program guide, the output of a synthesized voice in a toy, etc., there is provided an advantage of being able to reproduce a clear voice signal exceeding the sampling frequency in terms of audibility.

Further, although the emphasized output signal is sent out in a digital data form to one of various sound acoustic processors, such as a sound encoding device, a voice recognition device, a sound storage device, or a handsfree call device, in each of the above-mentioned embodiments, the voice emphasis device in accordance with each of the embodiments can be implemented via a single device or a DSP (digital signal processor) with another device as mentioned above. The voice emphasis device can be alternatively implemented by executing a software program as the voice emphasis device. The software program can be stored in a storage unit of a computer device which executes the software program, or can be distributed via a storage medium, such as a CD-ROM. As an alternative, the program can be provided via a network. Further, in addition to sending out the emphasized output signal to one of various sound acoustic processors, the emphasized output signal can be amplified by an amplifying device after D/A converted, and can be outputted as a direct sound signal from a speaker or the like.

While the invention has been described in its preferred embodiments, it is to be understood that an arbitrary combination of two or more of the above-mentioned embodiments can be made, various changes can be made in an arbitrary component in accordance with any one of the above-mentioned embodiments, and an arbitrary component in accordance with any one of the above-mentioned embodiments can be omitted within the scope of the invention.

INDUSTRIAL APPLICABILITY

Because the voice emphasis device in accordance with the present invention includes the band determinator that determines a band in which a high frequency component is reflected within a limit of a range which does not exceed a predetermined first frequency on the basis of the mode of an input signal, and can prevent a strange sound caused by a spectrum synthesis and perform an excellent, clear sound emphasis process, the voice emphasis device is suitable for use in car navigation, mobile phones, interphones, and sound collecting devices in which voice communications, a voice storage, a voice synthesis, and a voice recognition system are introduced.

EXPLANATIONS OF REFERENCE NUMERALS

1 input terminal, 2 time-to-frequency converter, 3 input signal analyzer, 4 band determinator, 5 high frequency component extractor, 6 spectrum compressor, 7 gain corrector, 8 spectrum synthesizer, 9 frequency-to-time converter, 10 output terminal, 11 autocorrelation analyzer, 12 noise spectrum estimator, 13 S/N ratio calculator, 14 power ratio analyzer, and 15 determinator.

The invention claimed is:

1. A voice emphasis device comprising:
   a time-to-frequency converter that converts an input signal in a time domain into a power spectrum which is a signal in a frequency domain;
   an input signal analyzer that analyzes the power spectrum of said input signal and based on the analysis decides a mode of the input signal;
   a band determinator that determines a boundary frequency within a limit of a frequency range which does not exceed a predetermined first frequency, the boundary frequency being changed depending on the mode of said input signal decided by said input signal analyzer;
   a spectrum compressor that compresses a power spectrum of frequencies in a band higher than said first frequency in a frequency direction;
   a spectrum synthesizer that reflects said compressed power spectrum in a band determined by both said first frequency and said boundary frequency; and
   a frequency-to-time converter that converts both a synthesized power spectrum outputted from said spectrum synthesizer and a phase spectrum of said input signal into ones in the time domain, to acquire an emphasized signal.

2. The voice emphasis device according to claim 1, wherein a gain corrector that, by correcting the power spectrum compressed by said spectrum compressor in such a way that power of the power spectrum before the compression in a band on which said spectrum compressor performs the compression is equal to that of the power spectrum after the compression, or by multiplying the power spectrum by a predetermined correction coefficient which is determined on a basis of a cause of auditory, performs power correction on said compressed power spectrum, and wherein said spectrum synthesizer reflects the power spectrum corrected by said gain corrector.

3. The voice emphasis device according to claim 1, wherein when said compressed power spectrum is reflected, said band determinator determines, as said boundary frequency, a frequency which provides a smallest difference in power with a power spectrum belonging to said first frequency.

4. The voice emphasis device according to claim 1, wherein said band determinator smooths a boundary frequency of a current frame in a temporal direction by using a boundary frequency of a preceding frame.

5. The voice emphasis device according to claim 1, wherein said spectrum synthesizer compares an S/N ratio of the power spectrum of said input signal and an S/N ratio of said compressed power spectrum, to select a power spectrum having a higher S/N ratio, and generates the synthesized power spectrum.

6. The voice emphasis device according to claim 1, wherein when an S/N ratio of said input signal is high, said band determinator sets said boundary frequency to a low one, and sets said boundary frequency to a higher one as said S/N ratio becomes low.

7. The voice emphasis device according to claim 1, wherein said spectrum synthesizer takes a weighted average on the power spectrum of the input signal and the compressed power spectrum, to generate the synthesized power spectrum.

8. The voice emphasis device according to claim 1, wherein when a plurality of peaks of power spectrum are generated within a predetermined frequency at a time of the compression, said spectrum compressor selects a larger component of power spectra corresponding to said plurality of peaks, or does not perform the spectrum compression at frequencies close to power spectra corresponding to said plurality of peaks.

9. The voice emphasis device according to claim 1, wherein when a plurality of peaks of power spectrum are generated within a predetermined frequency at a time when said spectrum synthesizer performs a synthesis, said spectrum synthesizer compares a component corresponding to each peak of the power spectrum of the input signal and that of a power spectrum of a high frequency component, to select a larger one of the components, or said spectrum compressor does not perform the spectrum compression at frequencies close to power spectra corresponding to said plurality of peaks.

10. The voice emphasis device according to claim 1, wherein the input signal analyzer is configured to decide, as the mode of the input signal, one of a vowel of voice, a consonant of voice, and noise; and the band determinator is configured to set a boundary frequency, which is applied to the consonant of voice decided as the mode of the input signal, to be lower than a boundary frequency applied to the vowel of voice or the noise decided as the mode of the input signal.

11. The voice emphasis device according to claim 10, wherein the band determinator is further configured to set the boundary frequency applied to the vowel of voice to be lower than the boundary frequency applied to the noise.

* * * * *